(12) United States Patent
Sakamura et al.

(10) Patent No.: US 11,614,571 B2
(45) Date of Patent: Mar. 28, 2023

(54) BLACK LIGHT SHIELDING MEMBER

(71) Applicant: SOMAR CORPORATION, Chuo-ku Tokyo (JP)

(72) Inventors: Hinoki Sakamura, Chuo-ku Tokyo (JP); Naoki Sakazume, Chuo-ku Tokyo (JP)

(73) Assignee: SOMAR CORPORATION, Tokyo (JP)

( * ) Notice: Subject to any disclaimer, the term of this patent is extended or adjusted under 35 U.S.C. 154(b) by 0 days.

(21) Appl. No.: 17/789,507

(22) PCT Filed: Dec. 25, 2020

(86) PCT No.: PCT/JP2020/048790
§ 371 (c)(1),
(2) Date: Jun. 27, 2022

(87) PCT Pub. No.: WO2021/132585
PCT Pub. Date: Jul. 1, 2021

(65) Prior Publication Data
US 2023/0046475 A1   Feb. 16, 2023

(30) Foreign Application Priority Data

Dec. 27, 2019 (JP) .............................. JP2019-239781

(51) Int. Cl.
*C23C 14/08* (2006.01)
*G02B 1/11* (2015.01)
(Continued)

(52) U.S. Cl.
CPC ............. *G02B 5/003* (2013.01); *C23C 14/08* (2013.01); *G02B 1/11* (2013.01); *G02B 5/22* (2013.01)

(58) Field of Classification Search
None
See application file for complete search history.

(56) References Cited

U.S. PATENT DOCUMENTS

| | | | |
|---|---|---|---|
| 2005/0063062 A1* | 3/2005 | Ito | G02B 5/0294 359/599 |
| 2007/0195431 A1* | 8/2007 | Asakura | G02B 1/111 359/707 |

(Continued)

FOREIGN PATENT DOCUMENTS

| | | | |
|---|---|---|---|
| JP | 2001350003 A | 12/2001 | |
| JP | 2006227268 A | 8/2006 | |

(Continued)

OTHER PUBLICATIONS

PCT International Search Report dated Mar. 16, 2021, in corresponding PCT application PCT/JP2020/048790, 4 pages in English.

*Primary Examiner* — Derek S. Chapel
(74) *Attorney, Agent, or Firm* — Juan Carlos A. Marquez; Marquez IP Law Office, PLLC

(57) ABSTRACT

Provided is a black light-shielding member, which has an excellent effect of anti-reflection that based on low glossiness and has a high blackness. A black light-shielding member including a substrate film, a resin-made light-shielding layer having a concave-convex shape formed on at least one surface of the substrate film, and a blackened layer formed on the resin-made light-shielding layer is produced. By adjusting an arithmetic mean surface roughness Ra of the surface on which the light-shielding layer and the blackened layer are formed to be 0.25 µm or more, and the maximum thickness of the blackened layer is less than the said Ra, a blackness with an L value of 12 or less is achieved.

6 Claims, 1 Drawing Sheet

(a)   (b)

(51) Int. Cl.
      *G02B 5/00*         (2006.01)
      *G02B 5/22*         (2006.01)

(56) References Cited

U.S. PATENT DOCUMENTS

| | | | |
|---|---|---|---|
| 2011/0164297 A1* | 7/2011 | Abe | C23C 14/0036 |
| | | | 359/227 |
| 2019/0257981 A1* | 8/2019 | Togawa | G02B 1/11 |

FOREIGN PATENT DOCUMENTS

| | | | |
|---|---|---|---|
| JP | 2010084203 A | 4/2010 | |
| JP | 2012203310 A | 10/2012 | |
| JP | 2012247518 A | 12/2012 | |
| JP | 2014152249 A | 8/2014 | |
| JP | 2019101402 A | 6/2019 | |
| WO | 2011145473 A1 | 11/2011 | |
| WO | WO-2013018467 A1 * | 2/2013 | ............ G02B 1/105 |
| WO | 2015159370 A1 | 10/2015 | |
| WO | 2018052044 A1 | 3/2018 | |

\* cited by examiner

BLACK LIGHT SHIELDING MEMBER

FIELD OF TECHNOLOGY

The present invention relates to a black light-shielding member, and more particularly, to a black light-shielding member that can be applied to optical devices, such as camera units of mobile phones including smartphones.

BACKGROUND ART

Generally, the light-shielding members are used for lens irises, shutters, and lens spacers of cameras.

As such a light-shielding member, it is known that a black film with a specified concave-convex shape is formed on the surface of a black polyester substrate including carbon black and so on. For example, a method of covering a light-shielding layer containing a matting agent on the surface of the substrate, roughening the surface of the substrate by sandblasting and so on is mentioned, as a method of forming the said concave-convex shape.

Patent Document 1 describes that, it is possible to manufacture a light-shielding member with an arithmetic mean surface roughness Ra by using the above-described method or the like, the Ra measured based on JIS B0601:2001 is 0.5 μm or more, and with the difference (Rp−Rv) between the maximum peak height Rp and the maximum valley depth Rv is less than 3. The light-shielding member in Patent Document 1 exhibits excellent anti-reflection performance even if it is thin, and has excellent hardness and adhesion between the light-shielding layer and the film substrate, so that excellent anti-reflection performance can be maintained for a long period of time.

PRIOR ART LITERATURE

Patent Document

Patent Document 1: International Publication No. WO2018/052044.

SUMMARY OF THE INVENTION

The Subjects to be Solved by the Invention

In recent years, for the purpose of improving the sense of design, there has been a demand for a member that makes the black color of a light-shielding member used in an optical device conspicuous. However, no satisfactory results have been obtained so far.

The present invention has been made in view of the said circumstances, and an object of the present invention is to provide a light-shielding member having an excellent anti-reflection effect based on low glossiness and high blackness.

Means for Solving Subjects

In view of the said subjects, the inventors and others have conducted in-depth research and found that the said subjects can be solved by forming a blackened layer on the basis of a concave-convex shape in the black light-shielding member with a substrate film and a resin-made light-shielding layer with the concave-convex shape formed on at least one surface of the substrate film, and further controlling the concave-convex shape of the surface of the light-shielding member. Thus, the invention is conceived. That is, the black light-shielding member of the present invention includes a substrate film, a resin-made light-shielding layer with a concave-convex shape formed on at least one surface of the substrate film, and a blackened layer formed on the said resin-made light-shielding layer, which is characterized in that, in the black light-shielding member, an arithmetic mean surface roughness Ra of the surface on which the light-shielding layer and the blackened layer are formed is 0.25 μm or more, and an L value is 12 or less, and the maximum thickness of the blackened layer is less than the said Ra.

Here, the resin-made light-shielding layer means that at least the concavo-convex portion forming the surface of the blackened layer is made of resin. For example, as will be described later, a structure in which a light-shielding layer containing a matting agent and/or not containing a matting agent is formed on the surface of a metal substrate film having a concavo-convex shape, that is also included in the resin-made light-shielding layer of the present invention.

In addition, the arithmetic mean surface roughness Ra described in the present invention is calculated based on JIS B0601:2001, and the L value is an L* value representing lightness in the L*a*b* color space and calculated based on JIS Z8781-4.

Preferably, the said resin-made light-shielding layer has a resin layer containing a matting agent and a resin component.

Moreover, the said resin-made light-shielding layer may contain a roughening portion formed on the surface of the substrate film.

On the other hand, preferably, the said blackened layer contains an inorganic type material.

Preferably, the said blackened layer includes at least one selected from magnesium fluoride, calcium fluoride, lithium fluoride, aluminum oxide, gallium oxide, and silicon oxide.

Moreover, preferably, the said blackened layer is formed by any of the methods selected from sputtering, vapor deposition, ion plating, and chemical vapor deposition (CVD) methods.

Furthermore, preferably, the maximum thickness of the said blackened layer is less than ½ of the value of arithmetic mean surface roughness Ra of the said surface.

Effect of Invention

The black light-shielding member of the present invention not only has an excellent antireflection effect due to low glossiness, but also has high blackness, clear blackness, and excellent design feeling. Therefore, it is also suitable for use as a camera unit of a mobile phone such as a smartphone.

EMBODIMENTS

Hereinafter, embodiments of the present invention will be described in detail.

In addition, in this specification, "~" indicating a range of values means that the range of values in which the upper limit and the lower limit are respectively recorded is included. Moreover, in the range of values, if the unit is recorded only for the upper limit, it means that the lower limit also has the same unit as the upper limit.

Among the ranges of values recorded periodically in this specification, the upper limit value or the lower limit value recorded in a certain range of values can also be the upper limit values or the lower limit values recorded in other ranges of values recorded periodically.

Moreover, among the ranges of values recorded in this specification, the upper limit value or the lower limit value recorded in a certain range of values may also be replaced with the values shown in embodiments.

In this specification, regarding the percentage or amount of each component in a composition, where more than one substances equivalent to each component are present in the composition, it refers to total percentage or amount of each of those substances present in the composition, unless specifically specified.

Hereinafter, embodiments of the present invention will be described in detail.

The black light-shielding member of the present invention includes a substrate film, a resin-made light-shielding layer having a concave-convex shape formed on at least one surface of the substrate film, and a blackened layer formed on the resin-made light-shielding layer, which is characterized by, in the black light-shielding member, an arithmetic mean surface roughness Ra of the surface on which the light-shielding layer and the blackened layer are formed is 0.25 μm or more, and blackness(L value) is 12 or less, and the maximum thickness of the blackened layer is less than the said Ra.

First, the concave-convex shape of the resin-made light-shielding layer of the present invention will be described with reference to the drawings.

Methods (A), (B) and (C) can be cited for the formation of the concave-convex shape of the resin-made light-shielding layer.

Figure 1:
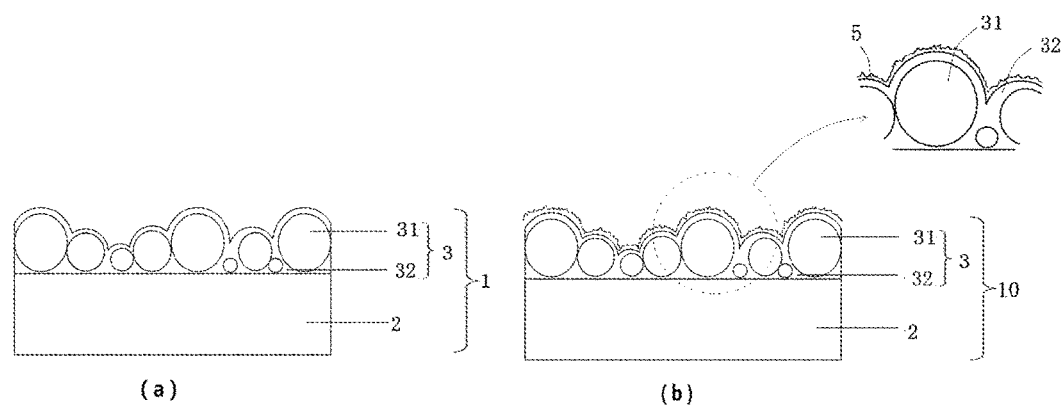
FIG. 1 is a schematic cross-sectional view showing a structure of a light-shielding member according to an embodiment of the present invention ((a) is before formation of a blackened layer, and (b) is after formation of a blackened layer).

In the method (A), as shown in FIG. 1(a), a light-shielding layer 3 containing a matting agent 31 and a matrix portion 32 is covered on the surface of the flat substrate film 2. On the surface of the light-shielding layer 3, concaves and convexes are formed by the matting agent 31. Here, the Ra on the surface of the light-shielding member 1 can be controlled by adjusting the particle size, particle size distribution, and content of the matting agent 31, the film thickness of the light-shielding layer 3, and the like. Moreover, it can also be controlled by adjusting the type of solvent, the concentration of solid component when preparing the coating liquid, and the coating amount to the substrate film. Furthermore, it can also be controlled by coating film manufacturing conditions, such as the coating method, drying temperature, time, and air volume during drying for the coating liquid.

Figure 2:
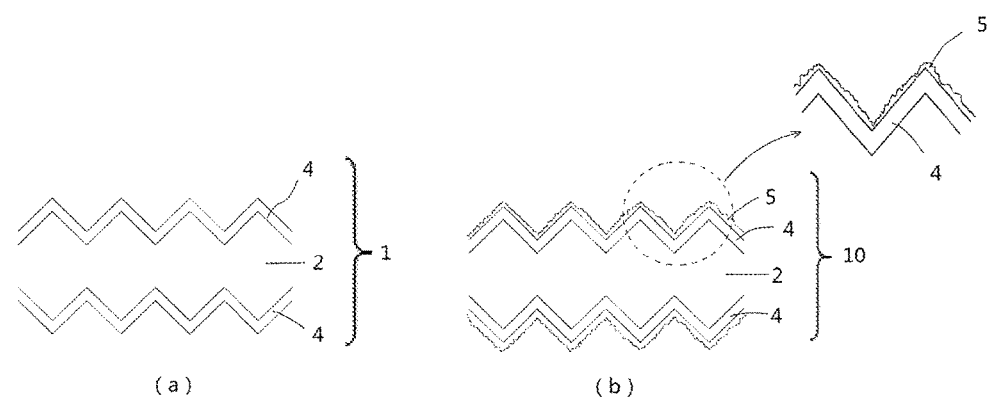
FIG. 2 is a schematic cross-sectional view showing a structure of a light-shielding member according to another embodiment of the present invention ((a) is before formation of a blackened layer, and (b) is after formation of a blackened layer).

In the method (B), as shown in FIG. 2(a), concaves and convexes are formed on the surface of the substrate film 2. When the substrate film is a resin-made film, for example, a sandblasting method can be applied in order to form the concaves and convexes. Here, the Ra can be controlled by controlling the particle size of the abrasive to be used, the injection pressure, and the like. Moreover, for example, a matting agent may be contained in the raw material of the substrate film to prepare a matting agent-containing substrate film. As the matting agent, it is preferable to use the same type of matting agent as described below for the light-shielding layer. The Ra on the surface of the substrate film is controlled by controlling the particle size, particle size distribution and content of the matting agent as well as the thickness of the substrate film.

Furthermore, it can also cover the coating liquid or the like on the substrate film 2 formed with the concaves and convexes, and a resin-made film 4 may be formed on the surface of the light-shielding member 1 that is similar to the concave-convex shape on the surface of the substrate film 2. Here, the resin-made film 4 on the surface of the light-shielding member contains resin components, such as acrylic resin, polyester resin, epoxy resin, urethane resin, urea resin, melamine resin, fluorine resin, imide resin and so on. The resin-made film 4 does not contain a matting agent, and by controlling the concave-convex shape of the resin-made substrate film 2 and the film thickness of the resin-made film 4, the Ra and the like on the surface of the light-shielding member 1 can be controlled.

In addition, the material and the film thickness of the said resin-made film 4 and the blackened layer described below are different. That is, the resin-made film 4 is formed of a resin component, and has a film thickness of about 1 to 50 μm, preferably about 2 to 10 μm. On the other hand, the blackened layer described below is formed of an inorganic material, or submicron-sized resin particles, and a binder resin component and the like, and has a film thickness of about 10 nm to 200 nm.

As a result of the above differences, in the black light-shielding member of the present invention in which the blackened layer is formed, a blackness having an L value of 12 or less is achieved.

In the method (C), as in the method (B), concaves and convexes are formed on the surface of the substrate film, and as in the method (A), a light-shielding layer containing a matting agent is covered on the surface of the light-shielding member. In this configuration, the Ra on the surface of the light-shielding member can be controlled by the concave-convex shape of the surface of the substrate film 2, the film thickness of the light-shielding layer, the particle diameter, particle size distribution and content of the matting agent in the light-shielding layer as well as production conditions of the light-shielding layer and so on.

Preferably, the black light-shielding member of the present invention is a structure in which a light-shielding layer is formed on at least one surface of the substrate film. In addition, in the following description, the light-shielding layer also consists of a resin-made film, which formed by the method (B), formed with the concave-convex shape (the roughened portion) on the surface of the substrate film as well as covered the surface of the concave-convex shape and without a matting agent.

Next, the specific material composition of the black light-shielding member of the present invention will be described.

(1) Substrate Film

The substrate film used in the present invention is not particularly limited, and may be a transparent or opaque substrate film. In addition, the substrate film of the present invention may be made of resin or metal.

Examples of the resin-made substrate film include polyolefins such as polyethylene, polypropylene, ethylene-propylene copolymers, polyolefins such as copolymers of ethylene and α-olefins having 4 or more carbon atoms, polyesters such as polyethylene terephthalate, polyamides such as nylon, ethylene-vinyl acetate copolymers, other general-purpose plastic films such as polyvinyl chloride and polyvinyl acetate, as well as engineering plastic films such as polycarbonate and polyimide.

In addition, examples of the metal substrate film include metal sheets using metals such as gold, silver, copper, aluminum, titanium, zinc, beryllium, nickel, tin and so on, the alloy sheets using phosphor bronze, copper nickel, copper beryllium, stainless steel, brass, duralumin and so on.

Among these materials, from the point of view of high strength, economy and versatility, it is preferred to use polyethylene terephthalate with two-way stretching, from the point of view of heat resistance, it is preferred to use polyimide film, and further from the point of view of high heat resistance, it is preferred to use metal sheet made of copper. When the substrate film is a resin-made substrate film, a high light-shielding material having an optical density of 2 or more, preferably 4 or more is obtained by kneading black coloring agents such as carbon black and aniline black into these materials in advance, a more excellent shielding effect can be obtained.

The thickness of the substrate film is not particularly limited, but when a resin-made substrate film is used, it is preferably 4 to 250 µm, and more preferably 12 to 100 µm. By setting the thickness to the said range, it can also be applied to a small and thin optical member. Moreover, when used in optical equipment, such as a camera unit of a mobile phone, it is preferable to set it as 4 to 20 µm.

In the case of using a metal substrate film, the thickness is preferably 6 to 40 µm, and especially when used in optical equipment, such as a camera unit of a mobile phone, it is preferably 10 to 20 µm.

When the said method (B) and method (C) are used, the surface of the substrate film is subjected to matting to form concaves and convexes (the roughened portion). The matting method is not particularly limited, and a known method can be used. For example, when the substrate film is a resin-made substrate film, chemical etching, blasting, embossing method, calendering, corona discharge, plasma discharge, chemical extinction (chemical mat method) formed by resin and roughing forming agent, and so on, can be used. Moreover, a matting agent may be directly contained in the substrate film, and the concaves and convexes may be formed on the surface of the resin-made substrate film. Among the above processing methods, from the point of view of shape control, such as convenience, economy and operation, it is preferred to use spray method, especially sand blasting method.

In the sandblasting method, the Ra and the like on the surface can be controlled by controlling the particle size of the abrasive to be used, the injection pressure, and the like. Moreover, in the embossing method, the Ra and the like on the surface can be controlled by adjusting the shape of the embossed roll and the pressure.

On the other hand, when the substrate film is a metal substrate film, the concaves and convexes can be formed on the surface by blackening treatment, blasting treatment, etching treatment and so on. In addition, when the substrate film is a metal substrate film, at least one of the following light-shielding layers with or without a matting agent required to be formed on the concave-convex surface (the roughened portion).

(2) Anchor (Fixed) Layer

In order to improve the adhesiveness between the substrate film and the light-shielding layer, a anchor layer may also be provided prior to placing the light-shielding layer on at least one surface of the substrate film. As the anchor layer, a urea-formaldehyde resin layer, a melamine resin layer, a polyurethane resin layer, a polyester resin, or the like can be applied. For example, the polyurethane resin layer can be obtained by coating a solution containing active hydrogen compounds such as polyisocyanate, diamine, glycol and the like on the surface of the substrate film and curing it. Moreover, when the anchor layer is a urea-formaldehyde resin or a melamine resin, it can be obtained by coating a solution containing a water-soluble urea-formaldehyde resin or a water-soluble melamine resin on the surface of the substrate and curing it. The polyester resin can be obtained by coating a solution dissolved or diluted with an organic solvent (methyl ethyl ketone, toluene, etc.) on the surface of the substrate and drying it.

(3) The Light-Shielding Layer

As described above, in the method (B), cover at least one surface of the substrate film with a light-shielding layer, except for the light-shielding component where only the concave-convex portion formed on the surface of the resin-made substrate film is provided as a light-shielding layer. Examples of the light-shielding layer include the light-shielding layer containing a matting agent used in the said methods (A) and (C), and the light-shielding layer (high hardness layer, thin film) that does not contain a matting agent used in the method (B).

Next, the structure of the respective light-shielding layer is explained.

i) The Light-Shielding Layer Containing a Matting Agent

As a component of the light-shielding layer, it contains resin components, matting agents and dyeing/conducting agents.

The resin components become a binder for matting agents and dyeing/conducting agents. The material of the resin components is not particularly limited, and any of thermoplastic resins and thermosetting resins may also be used. As the specific thermosetting resins, examples include acrylic resin, polyurethane resin, phenolic resin, melamine resin, urea formaldehyde resin, diallyl phthalate resin, unsaturated polyester resin, epoxy resin, alkyd resin, etc. In addition, as the thermoplastic resins, examples include polyacrylate resin (polyacrylic ester resin), polyvinyl chloride resin, butyral resin, styrene butadiene copolymer resin, etc. From the viewpoints of heat resistance, moisture resistance, solvent resistance, and surface hardness, the thermosetting resins are preferably used. As the thermosetting resins, considering the softness and strength and toughness of the film, acrylic resin is especially preferred.

The crosslinking of resin components can be promoted by adding the curing agent as a component of the light-shielding layer. As the curing agent, a functional group-containing urea compound, a melamine compound, an isocyanate compound, an epoxy compound, an aziridine compound, an oxazoline compound, or the like can be used. Among them, isocyanate compounds are particularly preferred. The mixing ratio of the curing agent is preferably 10 to 50% by weight relative to 100% by weight of the resin components. By adding the curing agent in the above range, a light-shielding layer with more suitable hardness can be obtained, and even when sliding with other members occurs, the Ra of the light-shielding layer can be maintained for a long time, and an excellent antireflection effect can be maintained.

In the case of using the curing agent, a reaction catalyst can also be used at the same time in order to promote its reaction. As the reaction catalyst, examples include ammonia, ammonium chloride, etc. The mixing ratio of the reaction catalyst is preferably in the range of 0.1 to 10% by weight relative to 100% by weight of the curing agent.

As the matting agent, resin-based particles or inorganic-based particles may be used. Examples of the resin-based particles include melamine resins, benzoic melamine resins (benzoguanamine resin), benzoic melamine/melamine/formalin polycondensates, acrylic resins, urethane resins, styrene resins, fluororesins, silicone resins and so on. On the other hand, as the inorganic particles, examples include silica, alumina, calcium carbonate, barium sulfate, titanium oxide, and the like. These may be used alone or in combination of two or more.

The average particle size, particle size distribution, and content of the matting agent vary depending on the thickness of the setting light-shielding layer and the degree of concave-convex shape on the surface of the substrate film, and are adjusted to obtain Ra required for the surface of the light-shielding member. In the case of the method (A), for example, when a light-shielding layer having a film thickness of 2 to 35 μm is formed on a substrate film having a smooth surface, the average particle diameter of the matting agent is usually preferably 1 to 40 μm. Moreover, when the film thickness of a light-shielding layer is 4-25 μm, it is preferable that the average particle diameter of the matting agent is 5-20 μm.

In the case of the method (C), for example, when a light-shielding layer having a film thickness of 1 to 35 μm is formed on a substrate film having a concave-convex shape, the average particle diameter of the matting agent is preferably 2 to 15 μm. Moreover, when the film thickness of a light-shielding layer is 2-7 μm, it is preferable that the average particle diameter of the matting agent is 2-10 μm.

The particle size distribution of the matting agent varies depending on the combination of the thickness of the light-shielding layer and the size of the selected matting agent, and cannot be generalized, but is preferably as sharp as possible. Moreover, the Ra and the like may be adjusted using a plurality of matting agents having different average particle diameters and particle size distributions.

The addition amount of the matting agent also varies depending on the average particle size and particle size distribution of the matting agent and the film thickness of the light-shielding layer, but in the case of the method (A), it is preferably 20-80% by mass relative to 100% by mass of the entire light-shielding layer. Moreover, in the case of method (C), 1-40% by mass is preferable.

By controlling the surface shape of the resin-made substrate film and the average particle size, particle size distribution, and content of the matting agent, and further controlling the film thickness of the light-shielding layer, etc., and adjusting the Ra and the like on the surface of the light-shielding layer, so that the excellent light-shielding characteristics can be exerted even under the condition of thin.

The shape of the matting agent is not particularly limited, but a spherical matting agent is preferably used from the viewpoints of the fluidity and the coating property of the coating liquid, the sliding properties of the obtained light-shielding layer, and the like. Further, in order to suppress the reflection of light, the matting agent may be dyed black with an organic or inorganic coloring agent. As the specific coloring agents, examples include carbon black, aniline black, carbon nanotube, etc. By using the matting agent dyed with carbon black and further adding carbon black or the like to the light-shielding layer as a dyeing/conducting agent, more excellent light-shielding properties can be obtained.

As the dyeing/conducting agent, the carbon black or the like is generally used. By adding a dyeing/conductive agent, the light-shielding layer is dyed, so that the anti-reflection effect can be improved, and a good antistatic effect can be obtained.

The average particle diameter of the dyeing/conducting agent is preferably 1 nm to 1000 nm, and more preferably 5 nm to 500 nm. By setting the particle diameter of the dyeing/conducting agent to the above range, a more excellent light-shielding property can be obtained.

Moreover, the content of the dyeing/conductive agent is preferably 9% to 38% by mass relative to 100% by mass of the entire light-shielding layer. By setting the content of the dyeing/conductive agent to the above range, a more excellent light-shielding property can be acquired.

In the present invention, as a component of the light-shielding layer, a leveling agent, a tackifier, a pH adjuster, a lubricant, a dispersant, an antifoaming agent and the like may be further added as required.

As the lubricant, in addition to polytetrafluoroethylene (PTFE) particles as a solid lubricant, polyethylene wax, silicone particles and the like can be used.

A homogeneous coating liquid is prepared by adding the above-mentioned components to an organic solvent or water, and mixing and stirring. As the organic solvent, for example, methyl ethyl ketone, toluene, propylene glycol monomethyl ether acetate, ethyl acetate, butyl acetate, methanol, ethanol, isopropanol, butanol and the like can be used.

The light-shielding layer is formed by applying the obtained coating liquid directly on the surface of the substrate film or on the preliminarily formed anchor layer, and drying it. The coating method is not particularly limited, and a roll coating method, a doctor blade method or the like can be used.

The thickness of the light-shielding layer in the present invention is preferably 1 μm to 35 μm. Especially when the matting agent is contained, in the case of the method (A), the thickness of the light-shielding layer is preferably 2 μm to 30 μm, and more preferably 4 μm to 25 μm. Moreover, in the case of the method (C), the thickness of the light-shielding layer is preferably 1 μm to 10 μm, and more preferably 2 μm to 7 μm.

By setting the thickness of the light-shielding layer to the above range, the desired antireflection effect and sliding property can be obtained. In addition, the thickness of the light-shielding layer containing the matting agent is the height from the surface of the film base material to the base part where the matting agent of the light-shielding layer does not protrude. The thickness of the above light-shielding layer can be measured based on JIS K7130.

ii) The Light-Shielding Layer without Matting Agent

Next, the light-shielding layer without the matting agent that used in the said method (B) is described. As described above, in this structure, the light-shielding property of the light-shielding member can be controlled according to the concave-convex shape of the substrate film, so that the light-shielding layer covering the surface of the substrate film needs to be set as a thin layer to maintain the concave-convex shape of surface of the substrate film. In such structure, the light-shielding layer functions as a conductive layer and a sliding layer.

As the components of the above light-shielding layer, a resin component and a dyeing/conducting agent are included.

The resin component may use the same material as the material of the light-shielding layer containing the matting agent.

The dyeing/conducting agent may use the same material as the material of the light-shielding layer containing the matting agent.

In the light-shielding layer of this structure, a leveling agent, a tackifier, a pH adjuster, a dispersing agent, an antifoaming agent, etc. may be further added as needed.

A homogeneous coating liquid is prepared by adding the above-mentioned components to water, alcohol or an organic solvent, and mixing and stirring.

The obtained coating liquid is directly or through the anchor layer formed in advance, coated on the surface of the substrate film with concave-convex shape, which has been subjected to matting processing in advance, and dried, so as to form a light-shielding layer. The coating method is not particularly limited, and a roll coating method, a doctor blade method, or the like can be used.

As this structure, without containing the matting agent, the thickness of the light-shielding layer is preferably 1 µm to 15 µm, and more preferably 2 µm to 10 µm. By setting the thickness of the light-shielding layer to in the above-mentioned range, conductivity, slidability, and the like can be imparted without suppressing the concave-convex shape of the substrate film. In addition, the thickness of the light-shielding layer which does not contain a matting agent is the thickness of the light-shielding layer itself that eliminates the undulation of the film substrate surface.

(4) The Blackened Layer

The black light-shielding member of the present invention is characterized in that a blackened layer is formed on the concaves and convexes of the resin-made light-shielding layer described in (3).

FIGS. 1(b) and 2(b) are schematic cross-sectional views of the black light-shielding member 10 of the present invention on which the blackened layer 5 is formed. It is considered that the blackened layer 5 of the black light-shielding member 10 of the present invention is thin, and has a structure in which minute layers (fine particles) exist unevenly on the resin-made light-shielding layer 3. Furthermore, through the diffuse reflection of (black) light generated on the blackened layer surface of such structure, it is inferred that the black light-shielding member of the invention has excellent anti-reflection effect based on low gloss, and blackness.

That is, the present invention has been accomplished based on the discovery that by forming a thin blackened layer on a resin-made light-shielding layer having a concavo-convex shape and adjusting the arithmetic mean roughness Ra of the surface to be 0.25 µm or more, thus achieving excellent anti-reflection effect based on low gloss and blackness with an L value of 12 or less than 12. The maximum thickness of the blackened layer is not particularly limited as long as it is less than the Ra, but is preferably 10 to 200 nm, more preferably 50 to 150 nm, and most preferably 70 to 110 nm.

In addition, the maximum thickness of the blackened layer can be calculated from a microscope observation photograph or the like.

The blackened layer may be an inorganic material or an organic material, or a mixed material or a composite material of an organic material and an inorganic material if the above conditions are satisfied. Examples of inorganic materials include metals such as gold, silver, copper, platinum, cobalt, tin, zinc, lead, palladium, ruthenium, neodymium, samarium, aluminum, magnesium, indium, gallium, bismuth, and their alloys, etc.; aluminum oxide, silicon oxide (silicon dioxide, etc.), titanium oxide (titanium monoxide, titanium pentoxide, titanium dioxide, etc.), indium tin oxide (ITO), cerium oxide, zinc oxide, chromium oxide ($Cr_2O_3$, etc.), gallium oxide, hafnium oxide, nickel oxide, magnesium oxide, niobium oxide (niobium pentoxide, etc.), tantalum oxide (tantalum pentoxide, etc.), yttrium oxide, zirconium oxide and other metal oxides and their complexes; magnesium fluoride, aluminum fluoride, calcium fluoride, cerium fluoride, lanthanum fluoride, lithium fluoride, sodium fluoride, neodymium fluoride, samarium fluoride, ytterbium fluoride, yttrium fluoride and other fluorides; titanium nitride, chromium nitride, carbon titanium nitride, titanium aluminum nitride, boron nitride, aluminum nitride, carbon nitride, boron carbon nitride and other nitrides; carbon (amorphous carbon, diamond, diamond-like carbon, graphite, etc.), titanium carbide, silicon carbide, boron carbide, tungsten carbide and other carbides.

Moreover, as an organic material, such as acrylic resin, styrene resin, silicone resin, fluorine resin and other submicron particles can be cited. Furthermore, an organic-inorganic hybrid material (organic-inorganic nanocomposite material) in which the above metal oxide and organic molecules are composited can also be used.

The method for forming the blackened layer is not particularly limited, and sputtering method, vacuum evaporation method, ion plating method, chemical evaporation (CVD) method and other dry methods can be used, as well as a coating method using the sol-gel method, and a wet method (wet method) such as a coating method for coating a dispersion solution formed by dispersing/mixing the materials of the blackened layer in the sol solution, solvent and binder components.

Among them, the dry method is preferable from the viewpoint of obtaining a more excellent blackening effect. It is considered that in the process of forming the blackened layer by the dry method, the nanoscale particles adhere to the convexes, concavities and slopes of the concavo-convex shape of the light-shielding layer, and more complex, the uneven concavo-convex shape is formed. It is speculated that in the light-shielding member with such a surface shape, the incident light is reflected and absorbed on the surface of the blackening layer, thus achieving better anti-reflection effect based on low gloss and blackness based.

Moreover, unlike the wet method, the dry method is preferred from the point of view that the surface roughness reduction caused by the deposit of the coating fluid in the concave does not occur. Furthermore, the dry method is also preferable from the viewpoint view of less adverse impact on the environment due to never using solvents and smaller equipment.

Among the dry methods, the sputtering method is preferable from the viewpoint of being excellent in adhesion to the light-shielding layer, scratch resistance, ease of thickness adjustment, and the like.

On the other hand, from the point of view of cost performance, the wet method is preferred because of its excellent economy, operability and yield and so on. It is presumed that in the wet method, the sol solution and disperse solution are coated on the convex portion, concave portion and inclined plane of the concave-convex shape of the light-shielding layer, and in the process of drying, the convection from bottom to top occurs when the solvent evaporates, so the uneven concave-convex shape is formed more complex on the surface of the light-shielding layer with concave-convex shape. It is speculated that in the light-shielding member with such a surface shape, the incident light is reflected and absorbed complexly on the surface of the blackening layer, thus achieving better anti-reflection effect and blackness based on low gloss.

The material, forming method and thickness of layer of the blackening layer can be set appropriately considering the required characteristics and cost of the light-shielding member and so on.

EXAMPLES

The present invention is further described in detail by the following examples, but the present invention is not limited to these examples. In addition, in the examples, unless otherwise stated, "%" and "parts" mean mass % and mass parts.

<Structure of the Black Light-Shielding Member>

(1) Substrate Film (1-1) Polyimide film: KAPTON 50MBC (thickness 12 μm), manufactured by Toray DuPont Co., Ltd.

(1-2) Copper foil film: NC-WS (thickness 12 μm), manufactured by Furukawa Electric Co., Ltd.

(1-3) Polyethylene terephthalate film: Both sides of Lumirror X30 (thickness 50 μm, manufactured by Toray Industries, Ltd.) are sandblasted to form concave-convex film on the surface.

(2) Light-Shielding Layer (a) Resin (a1) Acrylic resin: Acrydic A814, manufactured by DIC Corporation (b) Curing Agent (b1) TDI polyisocyanate: Coronate L, manufactured by Tosoh Corporation (c) Dyeing/Conducting Agent (c1) Carbon black; NX-592 black, manufactured by Dainisei Chemicals Co., Ltd.

(d) Matting Agent (d1) Acrylic filler: MX-200 (average particle size: 2 μm), manufactured by Soken Chemical Co., Ltd.

(d2) Acrylic filler: MX-300 (average particle size: 3 μm), manufactured by Soken Chemical Co., Ltd.

(d3) Acrylic filler: MX-500 (average particle size: 5 μm), manufactured by Soken Chemical Co., Ltd.

(3) Blackened Layer (3-1) Formation by Sputtering

A magnesium fluoride layer is formed by a sputtering method in an argon gas using a sputtering apparatus (model: CFS-4ES) manufactured by Shibaura Electromechanical Co., Ltd., using magnesium fluoride ($MgF_2$) as a target. Here, the final pressure is $3 \times 10^{-3}$ Pa, the sputtering pressure is $7.6 \times 10^{-3}$ Pa, and the Ar flow rate is 11 seem. In addition, a magnesium fluoride layer is previously formed on a flat substrate under predetermined conditions (200 W), and the relationship between the sputtering time and the thickness of the layer at this time is obtained. The sputter-formed films of magnesium fluoride formed on the condition that the layer thicknesses are 80 nm, 100 nm, and 120 nm, respectively, are referred to as thin films, intermediate films, and thick films, respectively.

(3-2) Formation by Dispersion Liquid Coating (3-2-1) Binder Component: Polyester Resin The coating liquid is prepared by mixing 1 part of magnesium fluoride particle dispersion solution (9076MF, a particle size of 39 nm, solid component 26%: manufactured by Tokuchi Co., Ltd.), 2 parts of resin solution dissolved in methyl ethyl ketone to make the polyester resin (Bylon 200: manufactured by Toyobo Co., Ltd.) concentration of 10% by mass, and 87 parts of methyl ethyl ketone. The obtained coating liquid is coated by a bar coating method, heated and dried to form a blackened layer with a thickness of about 100 nm.

(3-2-2) Binder Component: Silica

The coating liquid is prepared by mixing 1 part of the magnesium fluoride particle dispersion used in (3-2-1), 10 parts of the silica sol solution (Colcoat N-103X (solid component 2%), manufactured by Colcoat. Co., Ltd.) diluted to 20% by n-butanol and 90 parts of dipropylene glycol monomethyl ether. The obtained coating liquid is coated by a bar coating method, heated and dried to form a blackened layer with a thickness of about 100 nm.

(3-3) Formation Based on Sol-Gel Method

The coating liquid is prepared by mixing 25 parts of silica sol solution (Colcoat N-103X (solid component 2%), manufactured by Colcoat Co., Ltd.), 75 parts of solvent with water: isopropyl alcohol weight ratio of 1:2. The obtained coating liquid is coated by a bar coating method, heated and dried to form a blackened layer with a thickness of about 100 nm.

Examples 1 to 12, Comparative Examples 1 to 9

Each component of the above (2) light-shielding layer is added to the solvent at the mixing ratio (mass) shown in Tables 1 to 3, and the coating liquid was obtained by stirring and mixing. Here, as the solvent, methyl ethyl ketone and toluene are used.

Using the substrate films shown in Tables 1 to 3, the coating liquids of the compositions shown in Tables 1 to 3 are coated on one surface, and then dried at 100° C. for 2 minutes to form a light-shielding layer.

On the obtained light-shielding layer, the blackened layers shown in Tables 1 to 3 are formed by the method in the above (3). Tables 1 to 3 show the measurement results of the average thickness of the light-shielding layer, the average thickness of the blackened layer, the Ra of the light-shielding member, the glossiness with respect to incident light at an incident angle of 60°, and the L value. The arithmetic mean roughness Ra of the light-shielding member is calculated based on JIS B0601:2001, and the L value is calculated based on JIS Z8781-4. Moreover, for the measurement of the glossiness with respect to the incident light with an incident angle of 60°, the specular glossiness with respect to the incident angle of 60° is measured in accordance with JIS Z8741.

Moreover, the average film thickness of the light-shielding layer is measured based on JIS K7130. The thickness of the light-shielding layer containing the matting agent is set to be the height from the surface of the film substrate to the base portion where the matting agent of the light-shielding layer does not protrude. On the other hand, the thickness of the light-shielding layer which does not contain the matting agent is set to be the thickness of the light-shielding layer itself obtained by eliminating the undulations on the surface of the film base material.

The average film thickness of the magnesium fluoride blackened layer based on the sputtering method described in the table is not an actual measurement value, but the average film thickness of the magnesium fluoride layer formed by sputtering on a flat substrate under the same conditions as those formed on the light-shielding layer. Moreover, the average film thicknesses of the blackened layers based on the dispersion liquid coating method and the sol-gel method described in Table 3 are not actually measured values as in the formation of the blackened layers based on the sputtering method, but the average film thickness of their own blackened layer formed by dispersion coating method and sol-gel method to form on a flat substrate under the same conditions as those formed on the light-shielding layer.

As shown in Table 1, it can be seen that in reference example 1, which is a flat polyimide film, the Ra is low, 0.2 µm, glossiness is 35.4% at 60° incidence angle, the L value is 28.3, and anti-reflection effect based on low gloss and blackness are both low. In contrast, in comparative example 1, in which a light-shielding layer containing a matting agent is provided, the Ra is increased to 0.48 µm, the surface is roughened, and both the anti-reflection effect based on low gloss and blackness are improved, but the blackness is insufficient.

On the other hand, it is confirmed that in examples 1 to 3, in which the blackened layer is further set on the light-shielding layer as a magnesium fluoride sputtering film, and the gloss and L values at 60° incidence angle are greatly reduced, which has excellent light anti-reflection effect based on low gloss and blackness. In particular, compared with the black light-shielding member of comparative example 1 which does not have a blackened layer, the Ra of the black light-shielding members of example 1 and example 2 in which the blackened layer of the intermediate film and the thin film are formed is significantly increased from 0.48 µm to 1.28 µm and 1.32 µm. In addition, the Ra of the black light-shielding member of example 3 in which the thick blackened layer is formed is 0.49 µm, and compared with examples 1 and 2, the increase rate of Ra is low. Therefore, by making the film thickness of the blackened layer not too thick and setting it as an appropriate range, the concave-convex surface of the black light-shielding member can be further effectively made into a more complex shape, and the light-shielding member with excellent anti-reflection effect based on low gloss and higher blackness can be obtained.

In addition, compared with reference example 1, the gloss and the L values at 60° incident angle in reference example 2, in which the blackened layer of the middle film is formed on the flat polyimide film, are almost unchanged. Thus confirming the effect of the invention that a blackened layer is formed on the surface of the light-shielding layer with concave-convex shape.

Table 2 shows the comparison results of the Ra, glossiness at 60° incident angle and L value of the surface of the light-shielding member when the blackened layer of intermediate film is formed on the light-shielding layer surface with changed surface roughness with different particle sizes of the matting agent. As shown in comparative example 1, comparative example 4, and comparative example 5, by changing the particle size of the matting agent added to the light-shielding layer, it is found that the Ra on the surface changed, but in all the comparative examples, the L value exceeded 20, so sufficient blackness cannot be obtained. On the other hand, in example 1, example 4, and example 5 in which the blackened layer of magnesium fluoride of the intermediate film is formed by the sputtering method, it is confirmed that the glossiness and the L value at an incident angle of 60° are both greatly reduced, with excellent anti-reflection effect and high blackness based low gloss.

Example 6 in Table 3 shows the evaluation results of samples in which the light-shielding layer and blackened layer are formed in the same manner as in example 1, except that the copper foil film is used as the base film. Compared with comparative example 6 in which no blackened layer is formed, in example 6, the Ra increases and the gloss at 60° incident angle and L value are greatly reduced. Thus, it is confirmed that the effect of the invention can be obtained even if the metal substrate film is used as the substrate film.

Moreover, example 7 in which a polyethylene terephthalate film is used as the substrate film and the blackened layer is directly formed on the surface subjected to the blasting treatment, example 8 in which the blackened layer is formed after forming the matting agent-containing light-shielding layer on the surface subjected to the blasting treatment, as well as example 9 in which the blackened layer is formed after forming the light-shielding layer not containing the matting agent on the surface subjected to the blasting treatment are made the same evaluation. Compared with comparative example 7, comparative example 8, and comparative example 9 in which the blackened layer is not formed, the Ra of the light-shielding member of these examples is increased, and both the glossiness at an incident angle of 60° and L value are significantly decreased. Therefore, it can be seen that the effects of the present invention can be obtained regardless of the method of forming the concaves and convexes of the light-shielding layer.

In example 10, the black light-shielding member is prepared and evaluated in the same manner as in example 1, except that a sputtering layer is used instead of the blackened layer and it is set as a magnesium fluoride/polyester resin layer formed by dispersion coating. Compared with comparison example 1, the Ra of example 10 also increased, glossiness at 60° incident angle decreased, and L value decreased significantly. Therefore, it is confirmed that the blackened layer formed by wet process can also obtain the effect of the invention.

Moreover, in example 11, except that a sputtering layer is used instead of the blackened layer and it is set as a magnesium fluoride/polyester resin layer, in example 12, except that a sputtering layer is used instead of the silicon oxide layer, the black light-shielding member is prepared in the same manner as in example 1. Compared with comparative example 1, the Ra of both examples 11 and 12 increased, the glossiness at an incident angle of 60° decreased, and the L value decreased significantly. Therefore, it is confirmed that the effects of the present invention can be obtained by forming a thin and non-uniform blackened layer on the resin-made light-shielding layer, regardless of the method and material for forming the blackened layer.

DESCRIPTION OF SYMBOLS

1 Light-shielding member (before blackened layer is formed)

10 Light-shielding member (after blackened layer is formed)

2 substrate film

3 Light-shielding layer

31 Matting agent

32 base portion

4 Light-shielding layer (resin-made film)

5 blackened layer

TABLE1

| | | | | example 1 | example 2 | example 3 | comparative example 1 |
|---|---|---|---|---|---|---|---|
| black light-shielding member | substrate | (1-1) polyimide film (flat) | | ○ | ○ | ○ | ○ |
| | light-shielding layer | (a) resin | (a1) acrylic resin | 27.1 | 27.1 | 27.1 | 27.1 |
| | | (b) curing agent | (b1) polyisocyanate | 13.6 | 13.6 | 13.6 | 13.6 |
| | | (c) dyeing/conductive agent | (c1) carbon black | 18.9 | 18.9 | 18.9 | 18.9 |
| | | (d) matting agent | (d1) acrylic filler (2 μm) | — | — | — | — |
| | | | (d2) acrylic filler (3 μm) | 39.9 | 39.9 | 39.9 | 39.9 |
| | | | (d3) acrylic filler (5 μm) | — | — | — | — |
| | blackened layer | (3-1) sputtering method | magnesium fluoride | intermediate | thin | thick | — |
| evaluation results | average film thickness of light-shielding layer (μm) | | | 5 | 5 | 5 | 5 |
| | average film thickness of blackened layer (nm) | | | 100 | 80 | 120 | — |
| | Ra(μm) | | | 1.28 | 1.32 | 0.49 | 0.48 |
| | Gloss (%): incident angle 60° | | | 0.3 | 0.4 | 0.3 | 0.8 |
| | L value | | | 7.6 | 9.9 | 10.2 | 20.8 |

| | | | | reference example 1 | reference example 2 |
|---|---|---|---|---|---|
| black light-shielding member | substrate | (1-1) polyimide film (flat) | | ○ | ○ |
| | light-shielding layer | (a) resin | (a1) acrylic resin | — | — |
| | | (b) curing agent | (b1) polyisocyanate | — | — |
| | | (c) dyeing/conductive agent | (c1) carbon black | — | — |
| | | (d) matting agent | (d1) acrylic filler (2 μm) | — | — |
| | | | (d2) acrylic filler (3 μm) | — | — |
| | | | (d3) acrylic filler (5 μm) | — | — |
| | blackened layer | (3-1) sputtering method | magnesium fluoride | — | intermediate |
| evaluation results | average film thickness of light-shielding layer (μm) | | | — | — |
| | average film thickness of blackened layer (nm) | | | — | 100 |
| | Ra(μm) | | | 0.20 | 0.20 |
| | Gloss (%): incident angle 60° | | | 35.4 | 31.3 |
| | L value | | | 28.3 | 27.5 |

TABLE2

| | | | | example 1 | comparative example 1 | example 4 |
|---|---|---|---|---|---|---|
| black light-shielding member | substrate | (1-1) polyimide film (flat) | | ○ | ○ | ○ |
| | light-shielding layer | (a) resin | (a1) acrylic resin | 27.1 | 27.1 | 27.1 |
| | | (b) curing agent | (b1) polyisocyanate | 13.6 | 13.6 | 13.6 |
| | | (c) dyeing/conductive agent | (c1) carbon black | 18.9 | 18.9 | 18.9 |
| | | (d) matting agent | (d1) acrylic filler (2 μm) | — | — | — |
| | | | (d2) acrylic filler (3 μm) | 39.9 | 39.9 | — |
| | | | (d3) acrylic filler (5 μm) | — | — | 39.9 |
| | blackened layer | (3-1) sputtering method | magnesium fluoride | intermediate | — | intermediate |
| evaluation results | average film thickness of light-shielding layer (μm) | | | 5 | 5 | 5 |
| | average film thickness of blackened layer (nm) | | | 100 | — | 100 |
| | Ra(μm) | | | 1.28 | 0.48 | 1.78 |
| | Gloss (%): incident angle 60° | | | 0.3 | 0.8 | 0.7 |
| | L value | | | 7.6 | 20.8 | 8.6 |

| | | | | comparative example 4 | example 5 | comparative example 5 |
|---|---|---|---|---|---|---|
| black light-shielding member | substrate | (1-1) polyimide film (flat) | | ○ | ○ | ○ |
| | light-shielding layer | (a) resin | (a1) acrylic resin | 27.1 | 27.1 | 27.1 |
| | | (b) curing agent | (b1) polyisocyanate | 13.6 | 13.6 | 13.6 |
| | | (c) dyeing/conductive agent | (c1) carbon black | 18.9 | 18.9 | 18.9 |

TABLE2-continued

|  |  |  |  |  |  |
|---|---|---|---|---|---|
|  | (d) matting agent | (d1) acrylic filler (2 μm) | — | 39.9 | 39.9 |
|  |  | (d2) acrylic filler (3 μm) | — | — | — |
|  |  | (d3) acrylic filler (5 μm) | 39.9 | — | — |
|  | blackened layer | (3-1) sputtering method magnesium fluoride | — | intermediate | — |
| evaluation results | average film thickness of light-shielding layer (μm) |  | 5 | 5 | 5 |
|  | average film thickness of blackened layer (nm) |  | — | 100 | — |
|  | Ra(μm) |  | 0.64 | 1.51 | 0.53 |
|  | Gloss (%): incident angle 60° |  | 1.3 | 1.2 | 3.0 |
|  | L value |  | 21.6 | 11.6 | 26.9 |

TABLE3

|  |  |  |  | example 1 | comparative example 1 | example 6 | comparative example 6 |
|---|---|---|---|---|---|---|---|
| black light-shielding member | substrate | (1-1) polyimide film (flat) |  | ○ | ○ | — | — |
|  |  | (1-2) metal film (flat) |  | — | — | ○ | ○ |
|  | light-shielding layer | (1-3)PET film (spray treatment) |  | — | — | — | — |
|  |  | (a) resin | (a1) acrylic resin | 27.1 | 27.1 | 27.1 | 27.1 |
|  |  | (b) curing agent | (b1) polyisocyanate | 13.6 | 13.6 | 13.6 | 13.6 |
|  |  | (c) dyeing/conductive agent | (c1) carbon black | 18.9 | 18.9 | 18.9 | 18.9 |
|  |  | (d) matting agent | (d2) acrylic filler (3 μm) | 39.9 | 39.9 | 39.9 | 39.9 |
|  | blackened layer | (3-1) sputtering method | magnesium fluoride | intermediate | — | intermediate | — |
|  |  | (3-2-1) dispersion coating method | magnesium fluoride/polyester resin | — | — | — | — |
|  |  | (3-2-2) dispersion coating method | magnesium fluoride/silicon oxide | — | — | — | — |
|  |  | (3-3) sol gel method | silicon oxide | — | — | — | — |
| evaluation results | average film thickness of light-shielding layer (μm) |  |  | 5 | 5 | 5 | 5 |
|  | average film thickness of blackened layer (nm) |  |  | 100 | — | 100 | — |
|  | Ra(μm) |  |  | 1.28 | 0.48 | 1.25 | 0.49 |
|  | Gloss (%): incident angle 60° |  |  | 0.3 | 0.8 | 0.3 | 1.1 |
|  | L value |  |  | 7.6 | 20.8 | 7.5 | 27.6 |

|  |  |  |  | example 7 | comparative example 7 | example 8 | comparative example 8 |
|---|---|---|---|---|---|---|---|
| black light-shielding member | substrate | (1-1) polyimide film (flat) |  | — | — | — | — |
|  |  | (1-2) metal film (flat) |  | — | — | — | — |
|  | light-shielding layer | (1-3)PET film (spray treatment) |  | ○ | ○ | ○ | ○ |
|  |  | (a) resin | (a1) acrylic resin | — | — | 27.1 | 27.1 |
|  |  | (b) curing agent | (b1) polyisocyanate | — | — | 13.6 | 13.6 |
|  |  | (c) dyeing/conductive agent | (c1) carbon black | — | — | 18.9 | 18.9 |
|  |  | (d) matting agent | (d2) acrylic filler (3 μm) | — | — | 39.9 | 39.9 |
|  | blackened layer | (3-1) sputtering method | magnesium fluoride | intermediate | — | intermediate | — |
|  |  | (3-2-1) dispersion coating method | magnesium fluoride/polyester resin | — | — | — | — |
|  |  | (3-2-2) dispersion coating method | magnesium fluoride/silicon oxide | — | — | — | — |
|  |  | (3-3) sol gel method | silicon oxide | — | — | — | — |
| evaluation results | average film thickness of light-shielding layer (μm) |  |  | — | — | 5 | 5 |
|  | average film thickness of blackened layer (nm) |  |  | 100 | — | 100 | — |
|  | Ra(μm) |  |  | 1.30 | 0.43 | 1.86 | 0.66 |
|  | Gloss (%): incident angle 60° |  |  | 0.9 | 2.2 | 0.3 | 0.8 |
|  | L value |  |  | 8.9 | 30.5 | 7.5 | 20.8 |

TABLE 3-continued

|  |  |  |  | example 9 | comparative example 9 | example 10 |
|---|---|---|---|---|---|---|
| black light-shielding member | substrate | (1-1) polyimide film (flat) |  | — | — | ○ |
|  |  | (1-2) metal film (flat) |  | — | — | — |
|  | light-shielding layer | (1-3) PET film (spray treatment) |  | ○ | ○ | — |
|  |  | (a) resin | (a1) acrylic resin | 27.1 | 27.1 | 27.1 |
|  |  | (b) curing agent | (b1) polyisocyanate | 13.6 | 13.6 | 13.6 |
|  |  | (c) dyeing/conductive agent | (c1) carbon black | 18.9 | 18.9 | 18.9 |
|  |  | (d) matting agent | (d2) acrylic filler (3 μm) | — | — | 39.9 |
|  | blackened layer | (3-1) sputtering method | magnesium fluoride | intermediate | — | — |
|  |  | (3-2-1) dispersion coating method | magnesium fluoride/polyester resin | — | — | ○ |
|  |  | (3-2-2) dispersion coating method | magnesium fluoride/silicon oxide | — | — | — |
|  |  | (3-3) sol gel method | silicon oxide | — | — | — |
| uation results | average film thickness of light-shielding layer (μm) |  |  | 3 | 3 | 5 |
|  | average film thickness of blackened layer (nm) |  |  | 100 | — | 100 |
|  | Ra (μm) |  |  | 0.46 | 0.21 | 1.01 |
|  | Gloss (%): incident angle 60° |  |  | 12.5 | 25.4 | 0.5 |
|  | L value |  |  | 11.3 | 28.3 | 10.1 |

|  |  |  |  | example 11 | example 12 |
|---|---|---|---|---|---|
| black light-shielding member | substrate | (1-1) polyimide film (flat) |  | ○ | ○ |
|  |  | (1-2) metal film (flat) |  | — | — |
|  | light-shielding layer | (1-3) PET film (spray treatment) |  | — | — |
|  |  | (a) resin | (a1) acrylic resin | 27.1 | 27.1 |
|  |  | (b) curing agent | (b1) polyisocyanate | 13.6 | 13.6 |
|  |  | (c) dyeing/conductive agent | (c1) carbon black | 18.9 | 18.9 |
|  |  | (d) matting agent | (d2) acrylic filler (3 μm) | 39.9 | 39.9 |
|  | blackened layer | (3-1) sputtering method | magnesium fluoride | — | — |
|  |  | (3-2-1) dispersion coating method | magnesium fluoride/polyester resin | — | — |
|  |  | (3-2-2) dispersion coating method | magnesium fluoride/silicon oxide | ○ | — |
|  |  | (3-3) sol gel method | silicon oxide | — | ○ |
| uation results | average film thickness of light-shielding layer (μm) |  |  | 5 | 5 |
|  | average film thickness of blackened layer (nm) |  |  | 100 | 100 |
|  | Ra (μm) |  |  | 0.99 | 0.97 |
|  | Gloss (%): incident angle 60° |  |  | 0.6 | 0.6 |
|  | L value |  |  | 10.1 | 11.1 |

The invention claimed is:

1. A black light-shielding member, including a substrate film, a resin-made light-shielding layer having a concave-convex shape formed on at least one surface of the substrate film, and a blackened layer formed on the resin-made light-shielding layer, wherein
in the black light-shielding member, an arithmetic mean surface roughness Ra of a surface on which the resin-made light-shielding layer and the blackened layer are formed is 0.25 μm or more, and an L value is 12 or less, a maximum thickness of the blackened layer is less than the Ra, and the blackened layer contains at least one selected from magnesium fluoride, calcium fluoride, lithium fluoride, aluminum oxide, gallium oxide, and silicon oxide.

2. The black light-shielding member according to claim 1, wherein
the resin-made light-shielding layer has a resin layer containing a matting agent and a resin component.

3. The black light-shielding member according to claim 2, wherein the resin-made light-shielding layer includes a roughened portion formed on the surface of the substrate film.

4. The black light-shielding member according to claim 1, wherein
the resin-made light-shielding layer includes a roughened portion formed on the surface of the substrate film.

5. The black light-shielding member according to claim 1, wherein
the blackened layer is formed by any of the methods selected from sputtering, vapor deposition, ion plating, and chemical vapor deposition (CVD).

6. The black light-shielding member according to claim 1, wherein
the maximum thickness of the blackened layer is less than ½ of the value of arithmetic mean surface roughness Ra of the surface.

* * * * *